Figure 1:
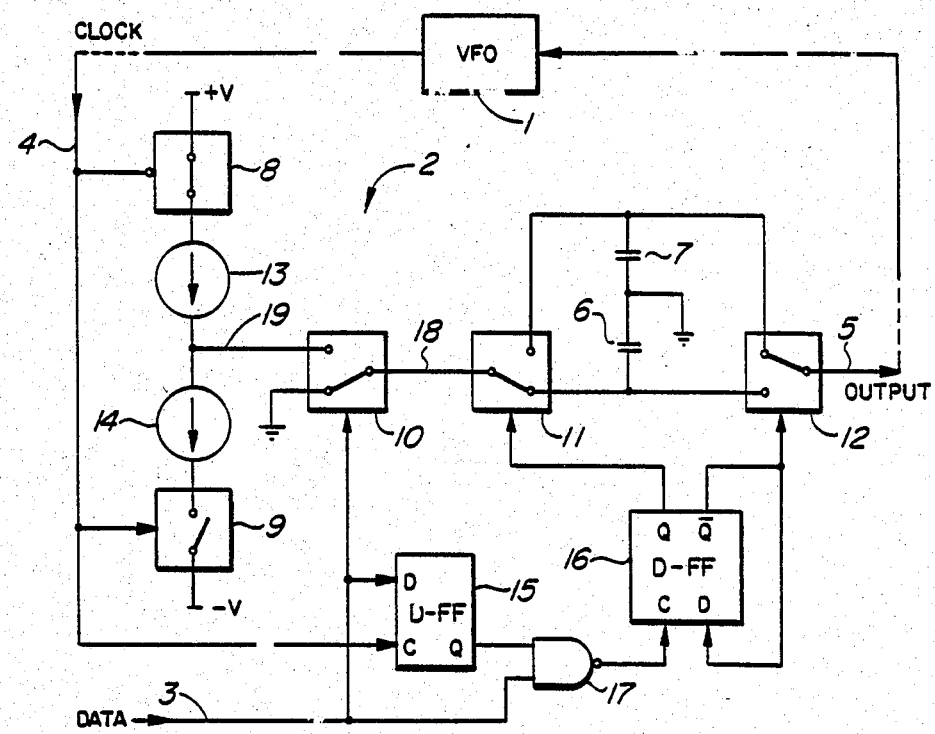

United States Patent [19]

Hogeboom

[11] Patent Number: 4,523,150
[45] Date of Patent: Jun. 11, 1985

[54] PHASE COMPARATOR USING TWO CAPACITORS ALTERNATELY CHARGED VIA CONSTANT CURRENT SOURCES

[75] Inventor: John G. Hogeboom, Nepean, Canada

[73] Assignee: Northern Telecom Limited, Montreal, Canada

[21] Appl. No.: 423,617

[22] Filed: Sep. 27, 1982

[30] Foreign Application Priority Data

Aug. 18, 1982 [CA] Canada .................................. 409618

[51] Int. Cl.³ .............................................. H03L 7/08
[52] U.S. Cl. .................................... 328/133; 307/511;
307/514; 307/519; 307/246; 307/247 R;
307/269; 328/55; 331/14; 331/17; 331/25;
375/120
[58] Field of Search ................... 307/200 A, 443, 511,
307/514, 516, 519, 529, 353, 246, 247 R, 269,
272 R; 328/55, 58, 109, 133, 139; 331/17, 25,
14; 375/119, 120

[56] References Cited

U.S. PATENT DOCUMENTS

| | | | |
|---|---|---|---|
| 3,982,196 | 9/1976 | Poujois | 307/272 X |
| 4,066,919 | 1/1978 | Huntington | 307/353 |
| 4,151,473 | 4/1979 | Coleman et al. | 328/134 |
| 4,167,711 | 9/1979 | Smoot | 331/25 X |
| 4,262,258 | 4/1981 | Gaalema | 307/353 X |
| 4,295,099 | 10/1981 | Evans | 307/353 X |
| 4,366,456 | 12/1982 | Ueno et al. | 307/353 X |

*Primary Examiner*—Stanley D. Miller
*Assistant Examiner*—D. R. Hudspeth
*Attorney, Agent, or Firm*—R. John Haley

[57] ABSTRACT

One of two capacitors in a phase comparator is discharged for a logic zero data input and is alternately charged with opposite polarities, depending on the state of a regenerated clock signal, for a logic one data input. The resultant charge of the capacitor when the data input again becomes zero is used to control a variable frequency oscillator which produces the clock signal, while the other of the two capacitors is discharged and then charged in the same manner. A phase locked loop including the phase comparator can accommodate arbitrary data sequences of a return-to-zero data signal and does not require a low pass filter.

5 Claims, 2 Drawing Figures

PHASE COMPARATOR USING TWO CAPACITORS ALTERNATELY CHARGED VIA CONSTANT CURRENT SOURCES

This invention relates to phase comparators.

It is known to provide a phase comparator in a phase locked loop to detect the relative phases of a data signal and a regenerated clock signal, and to use the phase comparator output to control an oscillator which produces the clock signal. For example, Coleman et al. U.S. Pat. No. 4,151,473 dated Apr. 24, 1979 describes one such arrangement in which the phase comparator uses a gated current source and sink to alternately charge and discharge a capacitor whose voltage is sampled to effect the phase comparison. This known arrangement, however, requires precise selection of the relative charging and discharging currents for proper operation, because the current source and sink are disabled during each sampling operation.

In addition, known phase comparator necessitate zero code suppression techniques being applied to the data in order to ensure satisfactory clock regeneration in the event that the data contains long strings of zeroes.

Accordingly, an object of this invention is to provide an improved phase comparator, especially for use in a phase locked loop for regenerating a clock signal from a return-to-zero data signal.

According to this invention there is provided a phase comparator for comparing the relative phases of a clock signal and a return-to-zero data signal, the phase comparator comprising: inputs for the clock signal and the data signal, and an output; two capacitors each having first and second terminals, the first terminals being coupled to a point of reference potential; means for coupling the second terminals of the two capacitors alternately to the output; means coupled to the data signal input for enabling, when the data signal has a first state, charging of that one of the two capacitors whose second terminal is not coupled to the output; means coupled to the clock signal input for charging said one capacitor, when charging is enabled, in opposite directions during respective half cycles of the clock signal; and means for controlling the means for coupling the second terminals of the two capacitors to interchange the connections thereof in response to the data signal adopting a second state.

The means for interchanging is preferably responsive to each transition of the data signal from the first state to the second state to interchange the capacitors, and the means for enabling preferably comprises means for discharging said one of the capacitors during the second state of the data signal.

Figure 2:
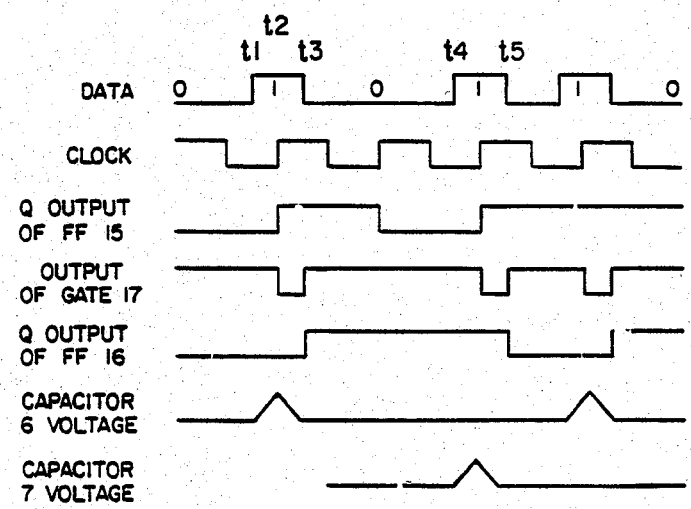

The invention will be further understood from the following description with reference to the drawings, in which:

FIG. 1 schematically illustrates a phase locked loop including a phase comparator in accordance with the invention; and FIG. 2 illustrates signal which can occur in operation of the phase comparator.

Referring to FIG. 1, a phase locked loop is illustrated comprising a variable frequency oscillator (VFO) 1 and a phase comparator 2. The phase comparator has an input 3 for a return-to-zero (RZ) data, a clock signal input 4, and an output 5, and serves to detect phase differences between the clock and data signals. The oscillator 1, which is for example as described in U.S. Pat. No. 4,465,983 issued Aug. 14, 1984, produces a clock signal, which is coupled to the clock signal input 4, at a frequency which is controlled by the phase comparator output, which is coupled to a control input of the oscillator via a resistor (not shown) which may be simulated by a switched capacitor. A low pass filter, conventional in phase locked loops, may also be provided in known manner but need not be in view of the characteristics of the phase comparator.

The phase comparator 2 comprises two capacitors 6 and 7, controlled switches 8, 9, 10, 11, and 12, constant current circuits 13 and 14, D-type bistable devices or flip-flops 15 and 16, and a NAND gate 17.

The switches 11 and 12 are controlled by the complementary outputs of the flip-flop 16, whose $\bar{Q}$ output is connected to its D input, to selectively connect one of the capacitors 6 and 7, for example the capacitor 6 as shown, to a line 18 and the other to the output 5. The switch 10 is controlled by the data signal from the input 3 to connect the line 18 to circuit ground as shown when the data signal is a logic zero, and to a line 19 when the data signal is a logic one. The constant current circuits 13 and 14 are alternately connected in the circuit by the complementary switches 8 and 9 respectively under the control of the clock signal from the input 4. Thus during alternate half cycles of the clock signal the circuit is able to supply current to the line 19, or the circuit 14 is able to sink current from the line 19. Thus if the data signal is a logic one the capacitor 6 or 7 selected by the switch 11 is charged in opposite directions, i.e. with opposite polarities, during successive half cycles of the clock signal.

The data signal is also latched by the clock signal in the flip-flop 15, whose Q output is gated with the data signal in the NAND gate 17 the output of which is connected to the clock input of the flip-flop 16.

FIG. 2 illustrates signals which can occur in operation of the phase comparator, assuming an RZ data signal sequence 010110. In FIG. 2 it is assumed that the regenerated clock signal is in synchronism with data signal, i.e. that positive-going transitions of the clock signal occur exactly in the middle of each logic one of the data signal, and hence that there is no phase error. In addition to the data and clock signals, FIG. 2 illustrates the signals at the Q outputs of the flip-flops 15 and 16, the output of the gate 17, and the voltages of the capacitors 6 and 7.

Initially the data signal is a logic zero so that the switch 10 has the state shown in FIG. 1, and the switch 11 is assumed to connect the capacitor 6 to the line 18 so that this capacitor is discharged. At a time t1 the data signal becomes a logic one while the clock signal is a logic zero so that the capacitor 6 is linearly charged positively via the switch 8, the circuit 13, and the switches 10 and 11. At a time t2 the clock signal becomes a logic 1 so that the data signal is latched in the flip-flop 15, the output of the gate 17 becomes a logic zero, and the capacitor 6 is linearly charged negatively via the switches 11 and 10, the circuit 14, and the switch 9. At a time t3 the data signal becomes a logic zero so that the output of the gate 17 becomes a logic one and the flip-flop 16 is toggled to change its state and the states of the switches 11 and 12. The data signal also causes the switch 10 to resume the position shown in FIG. 1 so that the capacitor 7 is discharged. The switches are arranged so that they open more quickly than they close, so that during the transitions at the time t3 the switch 11 connection to the capacitor 6 opens before the switch 10 closes to ground, whereby discharging of the capacitor 6 is avoided.

As the circuits 13 and 14 conduct the same current and the clock transition at the time t2 occurs exactly in the middle of the logic one data signal from the time t1 to the time t3, the capacitor 6 has a charge of zero at the time t3, when it is connected to the phase comparator output 5 via the switch 12. If the clock and data signals were not in phase, then the capacitor 6 would have a net positive or negative charge at the time t3 due to unequal charging times for the two polarities, resulting in a non-zero control voltage being applied to the control input of the oscillator 1 to correct its phase relative to the data signal.

From the time t3 to a time t4 the data signal is a logic zero so that the capacitor 7 is discharged via the switches 10 and 11. From the time t4 to a time t5 the data signal is a logic one so that the capacitor 7 is charged alternately positively and negatively in dependence upon the clock signal, the net charge, when the data signal again becomes a logic zero at the time t5, constituting a new control signal for the oscillator 1, the switches 11 and 12 being restored at this time to the states shown in FIG. 1.

Thus while the capacitor 7 is being discharged and charged the capacitor 6 provides a control voltage for the oscillator 1, and vice versa. As a result of the consequent substantially continuous control voltage for the oscillator 1, and the absence of significant clock frequency components in the control signal for the oscillator, the need for a low pass filter between the output of the phase comparator and the control input of the oscillator is substantially avoided. Furthermore, the continuous supply of the last control voltage to the oscillator until the next logic one-to-zero transition of the data signal, as at the times t3 and t5 in FIG. 2, ensures accurate clock regeneration in the presence of arbitrary data signal sequences, so that zero code suppression in the data signal is not required.

Although a particular embodiment of the invention has been described, numerous modifications, variations, and adaptations may be made thereto without departing from the scope of the invention as claimed. In particular it is observed that the switches 8 and 9 and the constant current circuits 13 and 14 may be replaced by other tyes of switched constant current means, such as gated current sources and sinks similar to those described in U.S. Pat. No. 4,151,473 referred to above.

What is claimed is:

1. A phase comparator for comparing the relative phases of a clock signal and a return-to-zero data signal, the phase comparator comprising:
   inputs for the clock signal and the data signal, and an output;
   two capacitors each having first and second terminals, the first terminals being coupled to a point of reference potential;
   means for coupling the second terminals of the two capacitors alternately to the output;
   means coupled to the data signal input for enabling, when the data signal has a first state, charging of that one of the two capacitors whose second terminal is not coupled to the output;
   means coupled to the clock signal input for charging said one capacitor, when charging is enabled, in opposite directions during respective half cycles of the clock signal; and
   means for controlling the means for coupling the second terminals of the two capacitors to interchange the connections thereof in response to the data signal adopting a second state.

2. A phase comparator as claimed in claim 1 wherein the means for controlling is responsive to each transition of the data signal from the first state to the second state to interchange the connections of the second terminals of the capacitors.

3. A phase comparator as claimed in claim 2 wherein the means for enabling comprises means for discharging said one of the capacitors during the second state of the data signal.

4. A phase comparator as claimed in claim 3 wherein the means for coupling and the means for controlling comprise a first switch for selectively coupling the second terminal of either of said capacitors to the means for enabling said charging, a second switch for selectively coupling the second terminal of the other of said capacitors to the output, a first bistable device for latching the state of the data signal in response to the clock signal, logic gate means for gating the data signal with the output of the first bistable device, and a second bistable device arranged to be triggered by the output of the logic gate means and to control the first and second switches.

5. A phase comparator as claimed in claim 3 wherein the means for charging comprises two switched constant current source means controlled by the clock signal for alternately supplying current to and sinking current from said one of the capacitors via the means for enabling.

* * * * *